United States Patent [19]

Maruyama et al.

[11] Patent Number: 5,309,388
[45] Date of Patent: May 3, 1994

[54] SOLID STATE MAGNETIC MEMORY DEVICE

[75] Inventors: Yooji Maruyama, Iruma; Ryo Imura, Tokorozawa; Kazuhisa Fujimoto, Kodaira, all of Japan

[73] Assignee: Hitachi, Ltd., Tokyo, Japan

[21] Appl. No.: 839,334

[22] Filed: Feb. 20, 1992

[30] Foreign Application Priority Data

Feb. 28, 1991 [JP] Japan .................. 3-34011

[51] Int. Cl.$^5$ .............................. G11C 19/08
[52] U.S. Cl. .......................... 365/87; 365/29
[58] Field of Search .................. 365/29, 87

[56] References Cited

U.S. PATENT DOCUMENTS 3,940,750  2/1976  Voegeli ................ 365/29
4,583,200  4/1986  Konishi et al. ......... 365/29

FOREIGN PATENT DOCUMENTS 59-101092  6/1984  Japan .
60-76080   4/1985  Japan ................ 365/29

Primary Examiner—Joseph A. Popek
Attorney, Agent, or Firm—Fay, Sharpe, Beall, Fagan, Minnich & McKee

[57] ABSTRACT

In a solid state magnetic memory device wherein the information storing region of a Bloch line memory device using Bloch lines generated in magnetic domain walls as information carriers is covered with a magnetic material film having stripe domains perpendicular to the magnetic domain walls, the information storing position is determined by the stripe domains and a memory density of more than several tens giga bits per cm$^2$ can be realized.

15 Claims, 3 Drawing Sheets

SOLID STATE MAGNETIC MEMORY DEVICE

BACKGROUND OF THE INVENTION

The present invention relates to a magnetic memory device, particularly to a solid state magnetic memory device which is suited to a miniature mass storage memory device.

In the recent information-oriented society, each individual handles an enormous amount of information. There is an increasing demand for high density solid state storage elements as memory devices as miniature information related equipment for processing such information. Magnetic bubble memory and Bloch line memory are well-known solid state magnetic memories. The Bloch line memory, as indicated in Japanese Patent Application Laid-Open No. 59-101092, has a feature that the memory density is higher by about 2 digits than that of the magnetic bubble memory because it stores information in a micro magnetization structure (Bloch line pair). When the memory density is increased, much information can be stored in a limited area, so that a memory device which is economical and easy to operate can be realized.

However, it is known that it is difficult to increase the memory density of the Bloch line memory device, which can be increased most, to more than 1 giga bits per cm$^2$. It is due to the structure of the conventional Bloch line memory device. This problem will be described with reference to FIGS. 2a and 2b.

FIG. 2a is a plan view of the information storing region of the conventional Bloch line memory. The information storing region comprises magnetic garnet films and a pattern group for determining the information storing position, which is called Bit Pattern 4, formed on the film. Magnetic domain walls 3 (a magnetization transition region which exists on the boundary between the magnetic domains) are provided almost perpendicularly to the bit pattern 4, and information, which is set to 1 or 0 in correspondence with the presence or absence of a micro magnetization structure formed on each magnetic domain wall which is called a Bloch line pair 2 (schematically indicated by arrows in the same way as with conventional patents), is stored. The bit pattern 4 comprises a magnetic material and others, and has a function for determining the stable position of each Bloch line pair by the interaction of the pattern strain field and the Bloch line pair. FIG. 2b is a schematic diagram of this status. FIG. 2b shows the shape of a potential well formed by the the interaction of the strain field and the Bloch line pair. The potential well periodically determines the stable position of the Bloch line pair.

The Bloch line memory moves each Bloch line pair to a predetermined position for input or output of information, converts the existence of the Bloch line pair to the existence of a bubble domain which can be read, or reversely converts the existence of the bubble domain to the existence of a Bloch line pair. This shift (also called propagation) of the Bloch line pairs is important for realizing the memory operation.

The shift of the Bloch line pairs can be realized by the force (acted in the tangential direction of each magnetic domain wall) generated by externally applying a pulsed magnetic field. By adjusting this force and the force for determining the Bloch line pair position, the Bloch line pair can be shifted to the position determination region of the neighboring bit pattern only when a pulsed magnetic field is externally applied. By doing this, the propagation function necessary of the memory operation can be realized.

The conventional Bloch line memory requires a bit pattern 4 which has the shape shown in FIG. 2a because it stores information. Since the bit pattern 4 comprises continuous simple rectangular patterns, it has been considered that the bit pattern 4 can be easily formed by the so-called lithographic technique using the optical means. As the memory density increases, however, the bit pattern size decreases to less than 1 micron and it becomes difficult to form the bit pattern 4 due to the optical resolution limit. To solve this problem, the X-ray lithography or the electron beam lithography which has a high resolution is required. The X-ray lithography or the electron beam lithography generally requires expensive equipment. Therefore, it is difficult to install such equipment so as to reduce the device production cost. Accordingly, the conventional method produces only solid state magnetic memories with a memory density of 10 Mb per cm$^2$ using bit patterns of more than 1 micron.

SUMMARY OF THE INVENTION

The object of the present invention is to establish a new information storing method for realizing a memory density of giga bits per cm$^2$ or so and to provide a very high density solid state magnetic memory device.

To accomplish the above object, the present invention provides a method that an information storing region using Bloch lines formed in magnetic domain walls around magnetic domains, which are generated in a ferromagnetic material such as a magnetic garnet film, as information carriers is covered with a magnetic material film and the information storing position is determined by a spontaneous magnetic domain formed by at least the intrinsic property of the magnetic material film.

The above magnetic material film has the original magnetic anisotropy in the film surface and an anisotropy perpendicular to the film surface, such as a Ni-Fe alloy (so-called permalloy) film, Co film, or Co-Pt alloy film. To improve the magnetic characteristics and durability, rare earth elements may be added to the above film material comprising those 3 d transition metal elements.

The thickness of the magnetic material film ranges from about 3000 Å to about 6 μm. When the thickness is less than about 3000 Å, the anisotropy perpendicular to the film surface is hardly formed. When the thickness is more than about 6 μm, the strain field perpendicular to the film surface becomes excessively strong and the memory device is adversely affected. Both cases are not desirable.

It is experimentally confirmed that the width of the spontaneous magnetic domain of the magnetic material film or the stripe domain structure (this is not the stripe domain structure constituting the information storing region) ranges desirably from 0.1 to 1.0 μm.

The width W of the spontaneous magnetic domain is expressed by Equation (1).

$$2W = 4\pi \sqrt[3]{\frac{\mu_0 A h}{2 M_s^2}} \tag{1}$$

where h indicates the film thickness, Ms the saturation magnetization, A the exchange constant, and $\mu_0$ the magnetic permeability ($4\pi \times 10^{-7}$). The width W can be set to a desired value by selecting a material having appropriate values of Ms, A, and $\mu_0$ and setting the film thickness to an appropriate value.

In place of the bit patterns in the prior art, the present invention determines the information storing position by locating the above magnetic material film in the information storing region. In this case, stripe domains corresponding to the bit patterns are required to be generated in the magnetic material film as a spontaneous magnetic domain structure. To generate stripe domains, the perpendicular magnetic anisotropy constant K of the magnetic material film is required to satisfy Equation (2).

$$K > \frac{3}{2} Ms \sqrt[3]{\frac{Ams}{2\mu_0^2 h^2}} \qquad (2)$$

The value of K is determined by deposition conditions of the magnetic material film such as the degree of vacuum, deposition speed, substrate temperature, and film thickness. Therefore, it is desirable to experimentally confirm deposition conditions of the magnetic material film for generating stripe domains on the magnetic material film and to deposit the magnetic material film under the conditions.

It is generally required that the longitudinal direction of the stripe domains on the magnetic material film is almost perpendicular to the magnetic domain walls of the ferromagnetic material under the magnetic material film where Bloch lines are generated. However, there is no practical problem caused when the right angle is shifted by up to about $\pm 45°$. The angle of the longitudinal direction of the stripe domains to the magnetic domain walls may range from 45° to 135°. When the variation of the angle between the stripe domains of the magnetic material film and the magnetic domain walls of the ferromagnetic material under the magnetic material film from the right angle is more than 45°, the movement of the magnetic domain walls where Bloch lines are generated is adversely affected.

When the magnetic material film production condition is within the above range, stripe domains are spontaneously generated. The longitudinal direction of stripe domains can be controlled by the wafer position in the deposition equipment and the substrate (wafer) rotation direction. By checking the longitudinal direction of stripe domains by conducting a preliminary experiment beforehand, the direction of magnetic domain walls to be set in the device production process can be controlled to a predetermined value (within the above range). When the direction of stripe domains (the longitudinal direction) is not perpendicular to magnetic domain walls on a ferromagnetic material such as the magnetic garnet film, the direction of the stripe domains of the magnetic material film is required, as mentioned above, to be perpendicular to the magnetic domain walls where Bloch lines are generated or to be within a range of 45° from the right angle so as to use the stripe domains of the magnetic material film in the same way as with conventional bit patterns. Therefore, by applying a high magnetic field in parallel with the magnetic material film surface and with the direction which the longitudinal direction of the stripe domains is required to be set to, the array direction of the stripe domains of the magnetic material film can be controlled to the above direction. When the intensity of the high magnetic field to be applied is more than that of the intrinsic saturation magnetic field of the magnetic material film, it is large enough. In the case of a Ni-Fe alloy film, the direction of stripe domains can be changed by applying a high magnetic field of about 10 KOe. The applied magnetic field is required to be removed after application.

Since the magnetic material film retains stripe domains as mentioned above, it is required that the magnetic material film has an anisotropy in the film surface and an anisotropy perpendicular to the film surface, that is, anisotropies in two axes. Even in the case of a Ni-Fe alloy film or a Co film, stripe domains cannot be obtained unless biaxial anisotropies are formed. When a film is formed, for example, by the deposition method or the sputtering method, biaxial anisotropies are formed and stripe domains are obtained.

In the present invention, as mentioned above, the information storing region has no pattern group with a shape and stores an information group under a continuous single film. By the interaction of the strain field generated from the spontaneous magnetic domain or the stripe domain structure formed by the intrinsic property of a magnetic material film covering the information storing region and of Bloch lines, the information storing position is determined. The direction of this stripe domain structure is determined by applying a high magnetic field in parallel with or perpendicularly to the surface of the magnetic material film covering the information storing region and then removing the high magnetic field, and then the information storing position is determined.

The length of each Bloch line formed in a magnetic domain wall around a magnetic domain which is generated in a ferromagnetic material is about 2 times the width of the magnetic domain wall where the Bloch line exists and about 1/10 of that of the magnetic domain. Assuming that it is an information carrier, it can store more than 10 Gb per cm$^2$ idealistically. By providing a function for writing or reading information at a part of the information storing region, stored information can be inputted or outputted when necessary. By providing a propagation function in the information storing region, only necessary information can be selectively inputted or outputted. By covering the information storing region with a magnetic material film and determining the information storing position by the spontaneous magnetic domain at least formed by the intrinsic property of the magnetic material film, the stable position of Bloch line pairs can be determined by the same action as that of conventional rectangular bit patterns. By doing this, the present invention does not require bit patterns with a geometrical shape in the information storing region.

In the present invention, the information storing region has no structural pattern group and stores an information group under a continuous single film so that an expensive memory device manufacturing facility is not required.

Furthermore, the magnetic material film of the information storing region has biaxial magnetic anisotropies so that the magnetization direction in the film can be changed periodically by the interaction of the magnetostatic energy and the exchange energy generated in the film. By doing this, a spontaneous magnetic domain can be formed in the film. By using the interaction of the strain field generated from this magnetic domain and the Bloch line pairs, the stable position of the Bloch line pairs can be determined by the same action as that of conventional rectangular bit patterns. The stripe domain structure generated in a permalloy film with biaxial magnetic anisotropies which is obtained by adjusting the film forming conditions is less than 1 μm in width. By constituting the information storing region with this structure, a memory device with a high memory density can be realized. The mechanism of the stripe domain structure is described in, for example, "Kyojisei No Butsuri" (Physics of Ferromagnetic Material) by Chikazumi (published by Shokabo).

Other than the above configuration, by providing the magnetic material film of the information storing region with at least dispersion of local anisotropy, the magnetization direction in the film can be changed periodically. This phenomenon is called a magnetization ripple which is well known in the study of thin magnetic films. Using the interaction of the strain field from a domain structure in a broad sense by this magnetization ripple and Bloch line pairs, the stable position of the Bloch line pairs can be determined by the same action as that of conventional rectangular bit patterns.

The solid state magnetic memory device of the present invention is characterized in that in place of the structure of the conventional Bloch line memory device with bit patterns on a ferromagnetic material such as the magnetic garnet film, a magnetic material film with a spontaneous magnetic domain covering the ferromagnetic material is provided on the ferromagnetic material. As to the other configuration, that of the conventional Block line memory device may be used. The solid state magnetic memory device of the present invention has, in the same way as the conventional one, a writing section for writing information into the information storing region, a reading section for reading information from the information storing region, and a propagation section for propagating information to the outside from the reading section.

DESCRIPTION OF THE PREFERRED EMBODIMENTS

Embodiment 1

An embodiment of the present invention will be described hereunder with reference to FIGS. 1a and 1b.

Figure 1A:
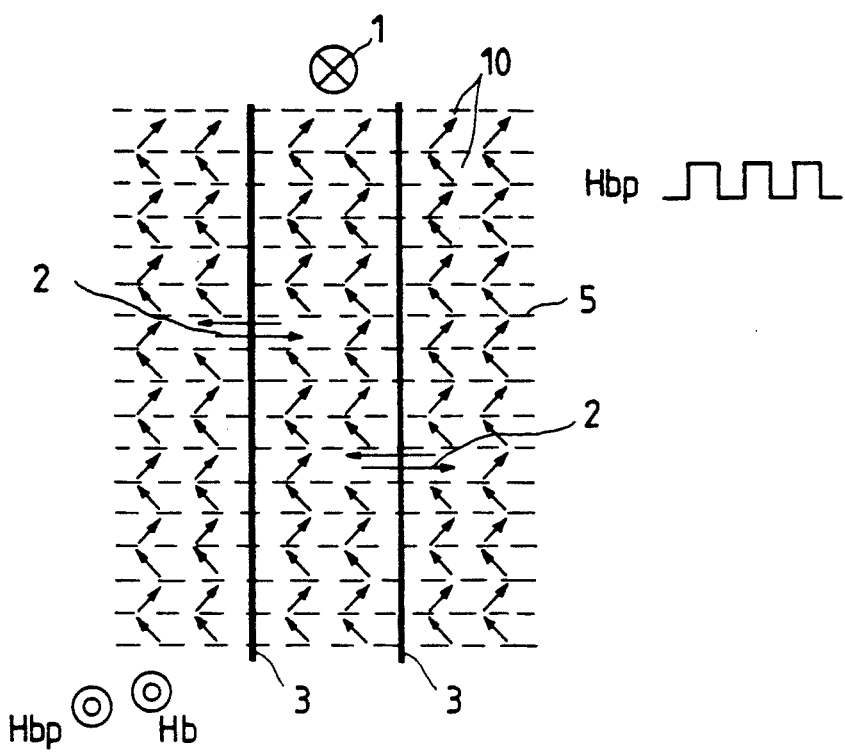
FIG. 1a is a plan view showing the information storing region of a solid state magnetic memory of an embodiment of the present invention.
Figure 1B:
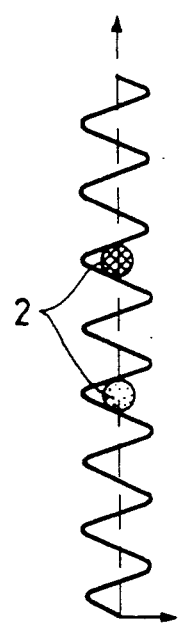
FIG. 1b is a schematic view showing the shape of a potential well of the information storing region of a solid state magnetic memory of an embodiment of the present invention.
Figure 2A:
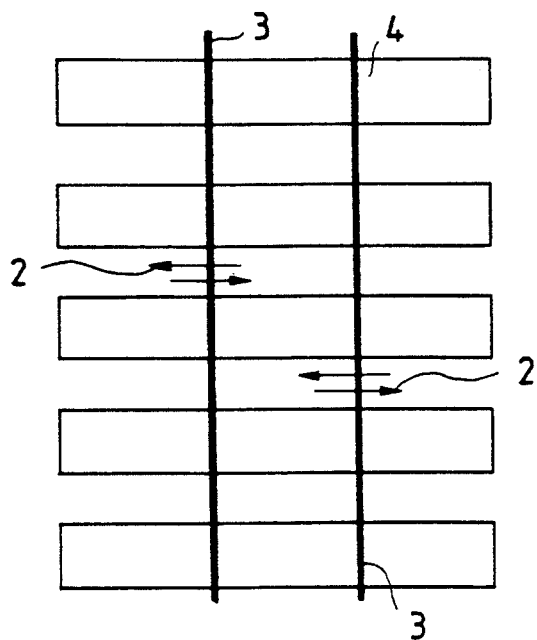
FIG. 2a is a plan view showing the information storing region of the conventional solid state magnetic memory.
Figure 2B:
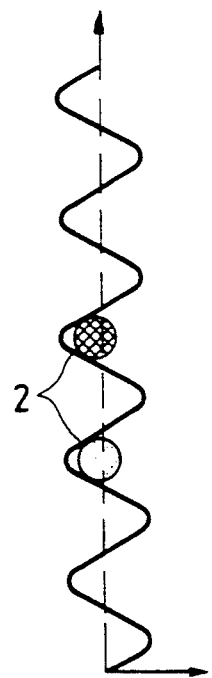
FIG. 2b is a schamatic view showing the shape of a potential well of the information storing region of the conventional solid state magnetic memory.

FIG. 1a is a plan view of the information storing region of a Bloch line memory device of the present invention and FIG. 1b shows the shape of a potential well of the information storing region. A magnetic material film 5 is attached to the overall surface of the magnetic garnet film of the information storing region. Stripe domains 10 formed by the following method exist on this magnetic material film. Magnetic domain walls 3 (magnetization transition regions existing on the boundaries of the magnetic domains of the magnetic garnet film) are provided almost perpendicularly to the stripe domains 10, and information, which is set to 1 or 0 in correspondence with the presence or absence of Bloch line pairs 2 (schematically indicated by arrows in the same way as with conventional patents) generated by the magnetic domain walls 3 (or the existence or absence of just Bloch lines), is stored. Numeral 1 shown in FIGS. 1a and 3 indicates the magnetization direction of the magnetic garnet film.

A bias magnetic field Hb is applied to the magnetic garnet film perpendicularly to the film surface so as to retain the magnetic domain walls 3. The Bloch line pairs 2 propagate information by applying a drive magnetic field Hbp. The waveform of the drive magnetic field Hbp, which is trapezoid in the same way as with the prior art, causes no problems. In the present invention, however, a method that a plurality of magnetic fields with a rectangular waveform are provided per propagation cycle provides a good operation margin. The possible reason is that by using a plurality of drive magnetic fields, the intensity of the drive magnetic field can be lowered and as a result, the interaction with the stripe domains can be decreased.

A permalloy film comprising 83 at % Ni and 17 at % Fe is used as a magnetic material film. Using the interaction of the strain field from the stripe domains 10 generated in the magnetic material film 5 and the Bloch line pairs, the stable position of the Bloch line pairs is determined. This status is schematically shown in FIG. 1b. FIG. 1b shows a potential well generated by the interaction of the strain field and the Bloch line pairs. This potential well provides a periodic stable position to the Bloch line pairs, and the bit position determination (determination of the stable position of the Bloch line pairs) is realized in the same way as with the prior art.

In this embodiment, the permalloy film has a magnetic anisotropy in one axis. Concretely, the deposition temperature is low such as from −150° C. to 100° C. and the degree of vacuum during deposition is about $10^{-4}$ Torr. Under the above conditions, a columner tissue (perpendicular to the film surface) is formed in the magnetic material film and a vertical magnetic anisotropy is generated by this tissue. The stripe domains are spontaneously generated so as to minimize the total of this anisotropy energy and the magnetostatic energy caused by the surface magnetic pole.

Figure 3:
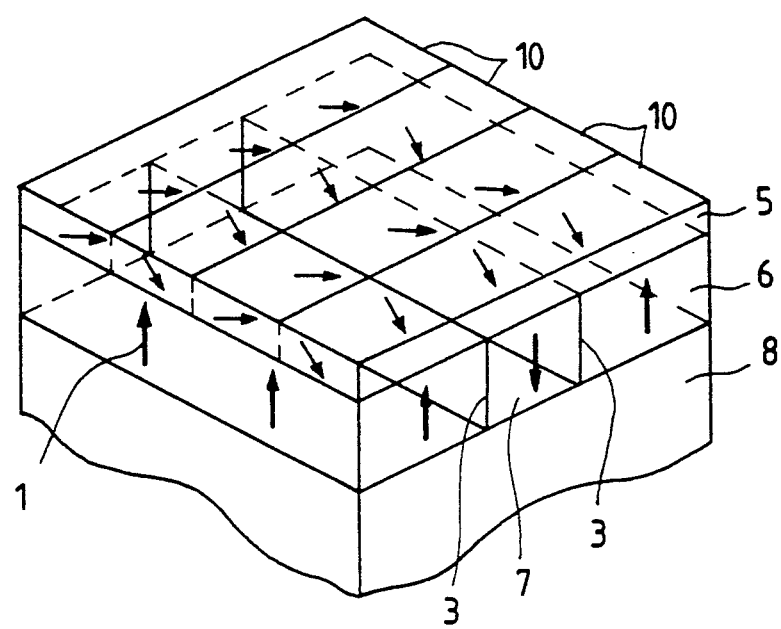
FIG. 3 is a perspective view showing the information storing region of a solid state magnetic memory of an embodiment of the present invention.

The above configuration will be supplementally illustrated in FIG. 3. The Bloch line pairs are generated in the magnetic domain walls 3 around the magnetic domain 7 in the magnetic garnet film 6 (the Bloch line pairs are not shown in the drawing). The magnetic garnet film 6 is a $(SmLuGd)_3(FeAl)_5O_{12}$ garnet film with a magnetic domain width of 0.5 μm. The magnetic garnet film 6 is grown to a thickness of 0.5 μm on a substrate 8 comprising $Gd_3GaO_{12}$ garnet by the liquid layer epitaxial method. The above permalloy film (magnetic material film 5) is formed with a thickness of 7000 Å on the magnetic garnet film 6 by the deposition method. Numeral 1 shown in FIG. 3 indicates the magnetization direction of the magnetic garnet film.

When the angle of the direction of the stripe domains to the magnetic domain walls constituting the information storing region is (or expected to be), as mentioned above, more than about ±45°, the stripe domain direction can be set within a predetermined range by applying a magnetic field of about 10k oersted (higher than the saturation magnetic field of the permalloy film) in parallel with the surface of the magnetic material film 5 and then removing the magnetic field. The stripe domains 10 shown in the drawing is formed by the above operation.

In this embodiment, the magnetic material film 5 is formed directly on the magnetic garnet film 6. If this occurs, the intensity of the strain field, which is acted on the Bloch line pairs from the magnetic material film 5, increases and it is effective in strengthening the position determination force. When a spacing is provided between the magnetic material film 5 and the magnetic garnet film 6, bad effects of the strain generated in the magnetic material on the magnetic garnet film can be prevented. It is also effective in eliminating the interaction of the magnetization in the magnetic garnet film and the magnetization in the magnetic material. Also in this case, the present invention can be executed without trouble by the same effect as with Embodiment 1.

When a spacing is to be used as mentioned above, a high molecular resin film such as SiO, $SiO_2$, or, for example, polyimide can be formed as a spacer by deposition, sputtering, or spin coating. The thickness of the spacer film is less than or equal to the pitch of the stripe domains. When the thickness of the spacer film is more than the pitch of the stripe domains, the strain field from the stripe domains is not acted on the magnetic garnet film 6. It is not desirable.

Figure 4A:
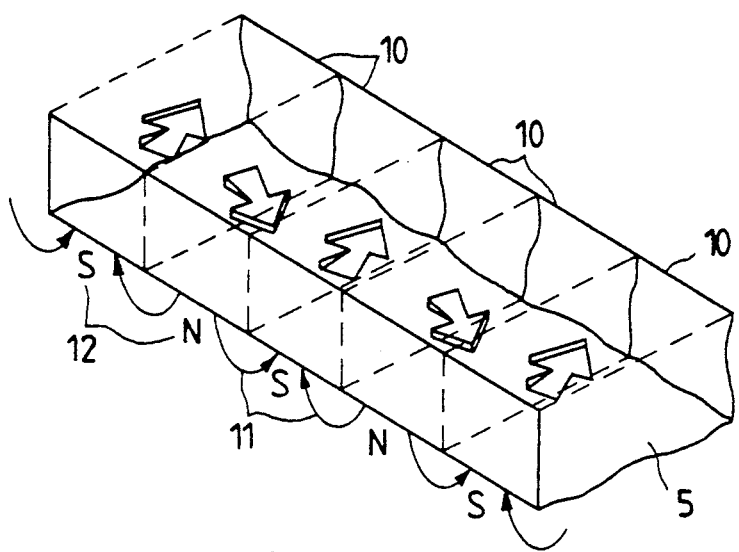
FIGS. 4a and 4b are schematic views showing the magnetization status of stripe domains of a magnetic material film of a solid state magnetic memory of an embodiment of the present invention.

In this embodiment, a permalloy film having the magnetization structure shown in FIG. 4a is used as a magnetic material film 5. The drawing shows that since the magnetization is inclined to the film surface, a magnetic charge 12 is generated on the film surface and a strain field 11 is generated by it. The strain field 11 changes its direction periodically, and it can be easily understood that a polarity inversion is generated in the interaction acting on the Bloch line pairs. By this effect, a potential well, which is the same as that of conventional bit patterns, is formed and the bit position can be determined in the same way as with the prior art.

Figure 4B:
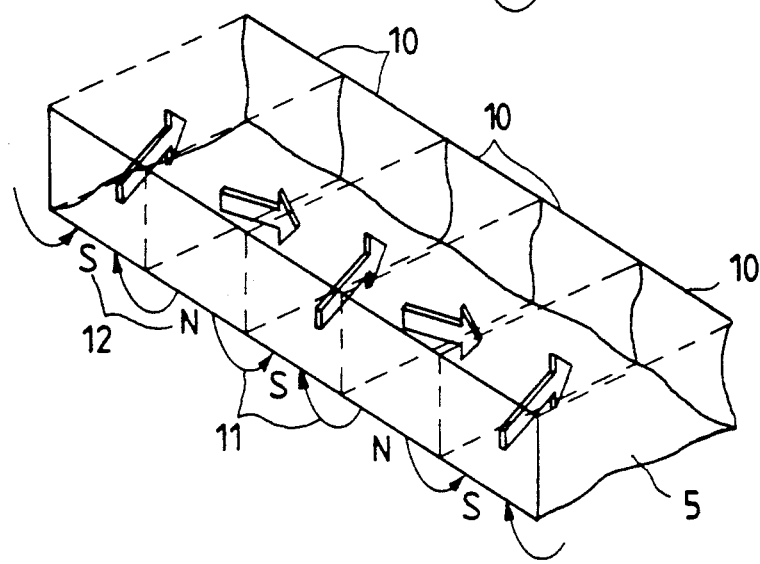

Even when a permalloy film which is the same as that shown in this embodiment is used, a different magnetization structure may be generated as shown in FIG. 4b. The possible cause is the thickness of the magnetic material film, though details are unknown. Even in this case, however, periodic stripe domains 10 are generated as shown in the drawing and the desired strain field 11 is obtained by them. It is confirmed that even in this case, the bit position can be determined in the same way as with the prior art.

Embodiment 2

As mentioned above, the first embodiment uses a permalloy film as a magnetic material film. Even in the case of a pure Co, Co base, or Ni base magnetic film, desired stripe domains can be formed by generating a magnetic anisotropy in the film and the present invention can be executed without trouble by using them. Particularly, when an in-plane magnetization film comprising Co-Pt alloy (Co: 75 at %, the balance: Pt) is used, it is characterized in that the intrinsic coercive force of the film is high compared with the permalloy film and the film is extremely stable for the magnetic field for driving the memory.

Reference example

In the magnetic domain structure in a broad sense which is obtained by providing the magnetic material film of the information storing region with at least dispersion of local anisotropy, a desired periodic strain field can be obtained. In this case, a magnetic film which does not include a ferromagnetic material element such as MnBi can be used as a magnetic material film. This is because the intrinsic anisotropy of the magnetic film is provided with much dispersion. This property is well known in the field of the conventional general magnetic storing technique. However, the property is conventionally considered to be a factor for impeding the magnetic dynamic characteristics of the film and has not been used positively. However, the cycle of the magnetic ripple is within a nanometer range, and by using it for bit position determination, a very high density memory device can be realized.

Various embodiments using the present invention are described above. It is important in the present invention that the bit position determination of Bloch line pairs is realized by a fine magnetic domain structure which is spontaneously generated. As a magnetic material film for satisfying it, besides the above magnetic film, alloy containing one of 3 d transition metal elements Fe, Co, and Ni or alloy containing a rare earth metal in addition to it may be used.

In the present invention, a $(SmLuGd)_3(FeAl)_5O_{12}$ film is used as a magnetic garnet film. When another magnetic garnet film is used, the present invention can be executed without trouble. Furthermore, by using Bloch lines generated in a rare earth element orthoferrite, hexagonal ferrite, or amorphous metal film other than the magnetic garnet film, the present invention can be executed. In this case, the adjustment of the Bloch line size and of the width of the spontaneous magnetic domain generated in the magnetic material film is important. However, data necessary for adjustment can be easily calculated from the magnetic characteristics obtained from measurement of the magnetization status. (For example, refer to Saito et al; J. Phys. Soc. Japan, Vol. 19, No. 7 (1964), pp. 1116–1125.) Therefore, even in this case, the present invention can be executed without trouble.

Since information carriers are retained (stored) by fine magnetic domains which are spontaneously generated in the magnetic material film provided on the surface of the solid state magnetic memory device, the memory density of several tens giga bits per $cm^2$ or so can be realized. In the conventional solid state memory device, bit patterns with a geometrical shape are required so as to retain information carriers. According to the present invention, fine patterns are not required, thus there is no restriction on the memory density of the memory device by pattern formation. The production cost of the memory device is low. The same numerals in the drawings indicate same components.

What is claimed is:

1. In a Bloch line memory device using Block lines generated in magnetic domain walls of magnetic domains generated in a ferromagnetic material as information carriers, a solid state magnetic memory device comprising a ferromagnetic material film covering said ferromagnetic material film wherein an information storing region comprising said information carriers is covered with said magnetic material film having biaxial magnetic anisotropies in parallel with and perpendicular to the film surface and the information storing position of said Block lines in said magnetic domain walls is determined by a spontaneous magnetic domain in said magnetic material film.

2. A solid state magnetic memory device according to claim 1, wherein said spontaneous magnetic domain is of a stripe domain structure.

3. A solid state magnetic memory device according to claim 2, wherein the longitudinal direction of said stripe domain structure forms an angle between 45° and 135° with said magnetic domain walls.

4. A solid state magnetic memory device according to claim 3, wherein said magnetic material film is a Ni-Fe alloy film or a Co film.

5. A solid state magnetic memory device according to claim 3, wherein the thickness of said magnetic material film ranges from 3000 Å to 6 $\mu$m.

6. A solid state magnetic memory device according to claim 3, wherein the width of said stripe domain structure ranges from 0.1 to 1 $\mu$m.

7. A solid state magnetic memory device according to claim 1, wherein by the interaction of a strain field generated from the spontaneous magnetic domain in said magnetic material film and of said Bloch lines, said information storing position is determined.

8. The solid state magnetic memory device according to claim 7, wherein a plurality of potential wells for Block line pair are periodically formed by said interaction of the strain field and the Block line pairs, and said Block line pair is propagated from one of said potential wells to another said potential well by applying a drive magnetic field from an external field.

9. A solid state magnetic memory device comprising an information storing region using Bloch lines formed in magnetic domain walls around magnetic domains generated in a ferromagnetic material as information carriers, a writing section for writing information into the information storing region, a reading section for reading information from said information storing region, and a propagation section for propagating information to the outside from the reading section, wherein said information storing region is covered with a magnetic material film and the Bloch line information storing position in said magnetic domain walls is determined by a magnetic domain which is spontaneously formed in the magnetic material film.

10. A solid state magnetic memory device according to claim 9, wherein said magnetic material film provided in said information storing region is a continuous single film.

11. A solid state magnetic memory device according to claim 9, wherein said magnetic material film contains one of 3 d transition metal elements Fe, Co, and Ni or a rare earth metal in addition to it.

12. A solid state magnetic memory device according to claim 9, wherein said magnetic material film has biaxial magnetic anisotropies.

13. A solid state magnetic memory device according to claim 9, wherein by the interaction of a strain field generated from said magnetic domain which is spontaneously formed by said magnetic material film and of the Bloch lines, said information storing position is determined.

14. A solid state magnetic memory device according to claim 9, wherein using said spontaneous magnetic domain formed by applying a magnetic field in parallel with or perpendicularly to the surface of said magnetic material film and then removing the magnetic field, said information storing position is determined.

15. A solid state magnetic memory device according to claim 14, wherein the magnetic field to be applied to said magnetic material film is higher in intensity than the saturation magnetic field of said magnetic material film.

* * * * *

UNITED STATES PATENT AND TRADEMARK OFFICE
CERTIFICATE OF CORRECTION

PATENT NO. : 5,309,388
DATED : May 3, 1994
INVENTOR(S) : Yooji Maruyama, et al.

It is certified that error appears in the above-indentified patent and that said Letters Patent is hereby corrected as shown below:

Claim 1, column 8, line 63 (or claim 1, line 1), delete "Block" and substitute therefor --Bloch--;
              line 67 (or claim 1, line 5), after "film" insert --for storing information and a magnetic material film--; and,
    column 9, line 5, delete "Block" and substitute therefor --Bloch--.

Claim 8, column 9, lines 31, 32, and 33, delete "Block" and substitute therefor --Bloch--.

Signed and Sealed this

Second Day of August, 1994

Attest:

BRUCE LEHMAN

*Attesting Officer*      *Commissioner of Patents and Trademarks*